United States Patent [19]

Mendelhall

[11] Patent Number: 4,970,566
[45] Date of Patent: Nov. 13, 1990

[54] HIGH SPEED PHOTO DETECTOR

[75] Inventor: Scott N. Mendelhall, Los Angeles, Calif.

[73] Assignee: TRW Inc., Redondo Beach, Calif.

[21] Appl. No.: 229,205

[22] Filed: Aug. 8, 1988

[51] Int. Cl.$^5$ .............................................. H01L 27/14
[52] U.S. Cl. ........................................ 357/30; 357/22; 357/16
[58] Field of Search ............... 357/23.7, 30 I, 30 M, 357/30 L, 22 A, 30 E; 350/96.12

[56] References Cited

U.S. PATENT DOCUMENTS

| | | | |
|---|---|---|---|
| 4,360,246 | 11/1982 | Figueroa | 357/16 |
| 4,424,525 | 1/1984 | Mimura | 357/22 A |
| 4,517,581 | 5/1985 | Thompson | 357/16 |
| 4,553,155 | 11/1985 | Chen et al. | 357/22 A |
| 4,591,889 | 5/1986 | Gossard et al. | 357/16 |
| 4,652,896 | 3/1987 | Das et al. | 357/16 |
| 4,734,750 | 3/1988 | Okamura et al. | 357/22 A |
| 4,740,823 | 4/1988 | Thompson | 357/30 I |
| 4,747,650 | 5/1988 | Sakuda | 357/19 |
| 4,787,691 | 11/1988 | Lorenzo et al. | 357/19 |
| 4,814,851 | 3/1989 | Abrokwah et al. | 357/16 |

OTHER PUBLICATIONS

Chen et al, "Ultrahigh Speed Modulation Doped Heterostructure Field Effect Photodetectors", Applied Physics Letters, 42(12), Jun. 15, 1983, pp. 1040-1042.

Primary Examiner—Andrew J. James
Assistant Examiner—Courtney A. Bowers
Attorney, Agent, or Firm—Ronald M. Goldman

[57] ABSTRACT

A light to electrical current conversion device, such as a photodetector, comprises an integral assembly of semiconductor material containing a relatively two dimensional electron stream; light waveguide means for receiving and propagating light energy; and the waveguide means being situated astride said relatively two dimensional electron stream for releasing electrons from portions of said semiconductor material adjacent said electron stream for travel into said electron stream. The device provides a fast response and high quantum conversion efficiency.

2 Claims, 1 Drawing Sheet

HIGH SPEED PHOTO DETECTOR

FIELD OF THE INVENTION

This invention relates to light responsive devices, such as photo detectors, and, more particularly, the invention relates to monolithic guided wave high electron mobility semiconductor type photo detectors and elemental light responsive microwave signal mixers.

BACKGROUND

Field Effect Transistors, FET's, are known semiconductor devices useful primarily as electronic amplifiers and switches. Its structure includes a pair of spaced electrodes, referred to as the source and the drain, respectively, located on a semiconductor substrate, such as gallium arsenide treated or "doped" with impurity to provide the requisite semiconductive property, and a third electrode, the gate, located in an elevated position above and between the aforerecited electrodes. In its operation electrical voltage applied to the gate creates an electric field essentially orthogonal to the plane of the substrate containing the source and drain electrodes. The level of the voltage and, hence, the electric field, influences the level of current passing between the source and drain electrodes through the semiconductor layer when an appropriate source of electrical power is connected therebetween. In a class of those devices, those referred to as high electron mobility transistors, or simply "HEMT", the current that flows passes through the semiconducting material in an essentially two dimensional sheet like formation, abbreviated as "2DEG", that is referred to as an electron stream or gas. The details of these FET devices summarized briefly above and the techniques of fabrication are well known and are described in the technical literature to which the reader may make reference for additional details.

Others have earlier discovered that when energy in the form of light is applied to this kind of semiconductor device, the light influences the mobility of electrons and the associated electron "holes", forming the electrical current between the source and drain electrodes, within the semiconductor media. That discovery suggests that the field effect device has physical and electronic characteristics suitable for application as a photo detector, an electrical device whose resistivity to current is regulated as a function of the intensity of the applied light. An article by Chen entitled "Ultra High Speed Modulation Doped Heterostructures Field Effect Photo Detectors", C. Y. Chen et al., Applied Physics Letters 42 (12), published June 15, 1983, describes experiments in which conventional high electron mobility field effect transistors are used as photo detectors. The experiments published in the article show that for 0.83 micrometer wavelength radiation injected in a direction perpendicular to the aluminum gallium arsenide-gallium arsenide interface between the FET's gate and drain, the speed of response of the FET is limited to the transit time of photo generated electrons across the gallium arsenide region; the electron transit time between the source and drain is not a limit to the FET's speed of response as may have been the prior thinking.

Applicant has also concluded that electrons photogenerated in the gallium arsenide may be swept into the quasi metallic two dimensional electron "gas" and, as alternatively characterized, the electron "holes" are expelled from that gas, by the inherent electric field existing in the aluminum gallium arsenide-gallium arsenide heterojunction. Due to the quasi metallic nature of the two dimensional electron gas, collected photo electrons are evidenced by a virtually instantaneous increase in source to drain channel current. By quasi metallic nature, reference is made to the fact that the factor sigma, the conductivity, which is equal to the product of N, the electron density, measured in electrons per cubic centimeter; E, the electron charge, measured in Coulombs; and Mu, the electron mobility, falls within the conductivity characteristic of the metallic regime.

Given that background and the applicants observation, the present invention provides a structure for an electronic device that realizes a very high speed response to light, which is a principal object of the invention and enhances quantum mechanical conversion efficiency of light responsive devices, such as photo detectors, an additional object of the invention. A further object is to provide a reduced electron drift time in a high electron mobility field effect type transistor photo detector. A still further object of the invention is to provide a photo detector utilizing semi-conductor material, such as gallium arsenide, having high optical responsivity, low noise, very high speed response, in the form of a monolithic structure capable of being manufactured by ordinary transistor fabrication techniques and which may be combined with other semiconductor devices in a monolithic or integral structure.

SUMMARY OF THE INVENTION

Briefly the invention provides a monolithic structure of a high electron mobility semiconductor device and a light waveguide. The waveguide is arranged so that as light inputted into the waveguide propagates, it interacts with and transfers energy to electrons in the semiconductor by means of which the source to drain current as monitored increases. In a more specific aspect, a semiconductor Field Effect Transistor photo detector device according to the invention contains a first layer of doped gallium aluminum arsenide material, the gallium aluminum arsenide layer preferably being of a thickness of one-tenth micrometer or less, a source and a drain spaced apart on said layer, defining an essentially two dimensional electron stream path therebetween through a portion of said layer, and a gate located in a position elevated over and in between the source and the drain; a light wave guide, suitably aluminum gallium arsenide, extends across the depth of the transistor adjacent and transverse said electron stream path. The light waveguide permits said inputted light to propagate parallel to the plane of said two dimensional electron gas so that portions of the light extend into the first layer to impart energy to and release electrons otherwise tightly held and said light is thereby absorbed and converted into electron hole pairs; whereby electrons released from the first layer by said light are swept into said electron gas to cause a change in current. A further improvement is characterized by having the optical waveguide structure provide for absorption of inputted light energy in a distance equal to the length of the FET device, typically a distance of two-hundred to three-hundred micrometers.

The impulse response is on the order of 2.7 pico seconds, which is a significant increase in speed as compared to the 27 pico seconds response time for the structure described in the Applied Physics Letter publication cited in the preceding paragraphs. In a further aspect to the invention, it is also found that the photo electrons produced by a traveling intensity modulated optical wave introduced into the photo detector are rapidly collected by the two dimensional electronic gas to produce an RF traveling wave disturbance on the source and drain electrodes; and that such disturbance may be detected and demodulated using conventional microwave electronics and/or combined with RF signals applied to the gate thereby serving as an electronic mixer.

The foregoing and additional objects and advantages of the invention together with the structure characteristic thereof, which was only briefly summarized in the foregoing passages, becomes more apparent to those skilled in the art upon reading the detailed description of the preferred embodiments, and the claims, which serve as part of this disclosure, which follows in this specification, taken together with the illustration of the preferred embodiments presented in the accompanying drawings.

DESCRIPTION OF THE PREFERRED EMBODIMENT

Figure 1:
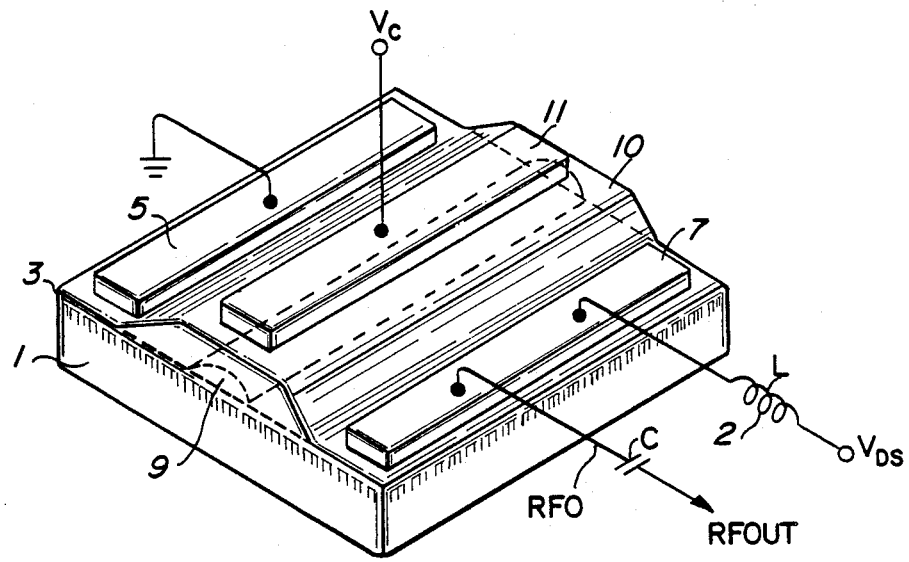
FIG. 1 is an enlarged perspective view of an embodiment of the invention.

FIG. 1 illustrates an embodiment of the invention, pictorially in perspective and to a greatly enlarged scale. As there shown, the photo detector includes a square shaped layer or substrate 1 of gallium arsenide material, the upper region 3 of which is doped with impurity, aluminum, in a conventional manner, to provide a region of gallium aluminum arsenide. A source electrode or, simply, source 5 extends along the left hand side of this substrate and a drain electrode or, simply, drain 7 extends along the opposed edge of the substrate spaced from the source 5. An optical or light waveguide 9, formed of gallium aluminum arsenide material, overlies the wafer shaped substrate.

A gate electrode or "gate", 11, extends along the top surface 10 of the upwardly protruding or bulge of semiconductor material containing waveguide section 9, which elevates the gate in respect to the source and drain. Waveguide 9 extends across the depth of the device, from one side of the layer to the other. In a typical device, the length of the device is of between two hundred micrometers and three-hundred micrometers. The front end illustrated serves as an optical input window through which external light is injected into the waveguide so that the light propagates thereacross as later described in connection with the devices operation.

Light waveguide 9 is made in several layers with the top layer having an index of refraction N1, and thickness of d1; the middle layer having an index of refraction N2 and a thickness of d2; and the bottommost layer having an index of refraction N5 and thickness of d3.

The relationship between the indices in such that N1 is less than N2, which in turn is greater than N3. The distribution of light within the waveguide as those skilled in the art recognize is varied by changing the thickness and index of refraction of the layers, while maintaining the relationship desired for propagating the light. The index of refraction selected is adjusted by simply changing the ratio of Aluminum to Gallium in the Aluminum Gallium Arsenide crystal $Al \times Gal_{-\times}As$.

The gallium arsenide substrate may be formed in a conventional manner through appropriate crystal growing techniques used in the semiconductor art. This includes a step in which as the crystal is grown, impurities are introduced, such as aluminum to form a semiconductive effect. In the present instance, the wafer is removed from processing and a portion to contain the source and drain is masked off to inhibit further growth. The areas on which the electrodes 5 and 7 are to be placed is thus covered. The crystal growth process is then continued so as to build up the protruding portion 10 containing the light waveguide. Following that process, the mask is removed from the side end and the three electrodes are applied using standard photo resist techniques. In that context, the layers of differing indices of reflection in the waveguide structure is accomplished by known molecular beam epitaxy processing procedures, which allows one to layer in as fine a layer as one molecule in thickness. Diffusion processes, also known to those skilled in the art, may also be used. Since the details of fabrication are known to those skilled in the semiconductor fabricating art to which reference is made, they are not further described.

In use a source of voltage VDS is connected to 7 drain in series with an inductor or choke 2, and electrical ground is connected to source 5 and a control voltage Vc is connected to gate 11 as is symbolically represented in the figure. Typically VDS is on the order of 5 to 12 volts and control voltage Vc falls within the same range. The output is taken in the form of RF, high frequency through a connection RFO as indicated, which suitably includes a series capacitor, C, to provide DC isolation between the electrical apparatus to which it is attached. Although the waveguide is illustrated in FIG. 1, symbolically, by dash liens as encompassing a portion of the upwardly protruding portion for ease of understanding and illustration, it is recognized in practice that the waveguide encompasses the entire protruding portion as better illustrated by the dash lines, WG, in FIG. 2 to which reference is made.

Figure 2:
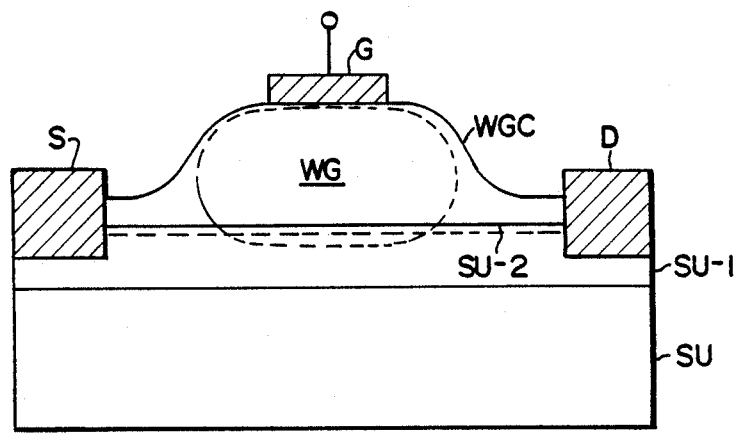
FIG. 2 is a pictorial end view of the embodiment which assists in the explanation of the mode of operation of the embodiment of FIG. 1.

The mode and theory of operation is described in connection with the pictorial side view illustrated in FIG. 2 in which the source gate and drain are represented as S, G, and D, respectively, and the substrate SU, which is a semi-insulating layer, the layer SU1, which is the insulating region of undoped gallium arsenide, the layer SU2, the doped portion containing the semi-conductor properties, the protruding portion, which integrally contains the light waveguide is represented as WG. In the embodiment element, SU is of gallium arsenide, element SU1 is gallium arsenide (undoped), SU2 is doped gallium arsenide, and element WG is aluminum gallium arsenide. It is a known fact that Gallium Arsenide possesses a higher index of refraction than Aluminum Gallium Arsenide.

In normal operation of a high electron mobility field effect transistor, current flows in the doped region between the source and drain electrodes, the level of that current is regulated by the voltage level of the voltage applied to the gate, which serves as a high impedance, low current input to the device. The source to drain current is concentrated along a thin relatively two dimensional "sheet" like layer SU2 as illustrated by the dash lines, which is referred to as a two dimensional "electron gas". The waveguide window, as presented in end view in this illustration, is ridged so as to admit light in a 0.83 micrometer waveguide mode. The light propagates essentially orthogonal to the plane of the drawing along the length of the waveguide with some of the photons in the propagating light wave extending, leaking outside of the side of the waveguide down into the area near and in the electron gas as represented by the cross-hatching portion in the figure to overlap into the underlying layer.

Theoretically it may be considered that the waveguide is essentially of a lossy or leaky characteristic; it is such as to permit the light inputted to the waveguide to be absorbed into the underlying Gallium Arsenide in a distance equal to the width of the field effect transistor device; that is, by the time the remaining light energy reaches the back end of the waveguide, the light is fully absorbed. This is comparable to viewing a "black, hole" in which all light is absorbed. The terms lossy and leaky are intended to refer to the fact that the power in the light is transferred to the Gallium Arsenide layer. The light transfers its energy to the Gallium Arsenide and in that sense enhances the operation of the device; the light is not dissipated needlessly.

The wavelength of the light is selected from within a range, usually below 0.87 micrometers, from the following determination, which may be empirically made. If the wavelength of the light is too large, that is, larger than the "band gap" in the semiconductor material, Gallium Arsenide in the example given, the light will not excite or release electrons from the semiconductor layer. Conversely, if the wavelength is too short, the energy level is greater than the band gap of the waveguide medium, Aluminum Gallium Arsenide in the specific example given, and consequently excites electrons in the waveguide. Those electrons generated in the waveguide are too distant from the electron gas and the electric fields in that area are such as to cause the electrons to move away from the electron gas, which is contrary to the mode that is desired. Effectively the radiant energy is consumed creating electrons in the wrong area and the device does not properly function.

The wavelength chosen in the example given 0.83 is appropriate; and 0.87 micrometers is believed to be the upper wavelength limit in that example. The lower limit has not as yet been determined. For other semiconductor materials, the light wavelength may be different; the limits may be empirically determined.

In propagating through the waveguide, the light radiation may be viewed as a stream of photons or light particles, each with an energy, E, of hu or hc/$\lambda$ electron volts, where h represents Plank's constant and $\lambda$ represents the wavelength. These photons in turn release electrons from the material. When a photon of sufficient energy strikes an atomic center in the crystal lattice, it dislodges electrons from the lattice, leaving an electronic vacancy, referred to as a "hole", and creating an electron-hole "pair". Both holes and electrons contribute to electrical conduction in semiconducting solids.

In the invention, the photons propagating through the Aluminum Gallium Arsenide waveguide have sufficient energy to dislodge electrons in the Gallium Arsenide lattice, but do not have sufficient energy to dislodge electrons in the Aluminum Gallium Arsenide lattice. Thus, electron hole pairs are created only in the Gallium Arsenide material which is physically located very near to the two dimensional electron gas previously described. The proximity between the optical waveguide and the two dimensional gas at the interface or boundary is purposeful and is controlled by the mechanical dimensions and chemical composition of the optical waveguide structure. These photoelectrically generated electron hole pairs are thus created all along the edge of the elongated waveguide as the light inputted propagates therealong.

The "built in" electric field at the interface or heterojunction between the adjoining layers draws the photogenerated negatively charged electrons into the two dimensional electron gas and expels the positively charged holes. A negatively biased base or substrate electrode supplies electrons to recombine with the positively charged holes. The electrons of the aforesaid electron hole pair are swept up into the electron gas stream and contribute to the source-to-drain current in an amount proportional to the strength of the optical signal or light inputted into the waveguide. It represents an almost instantaneous increase in the current level. In that way, the device functions as a photo detector. With a sudden increase in current, the level of, voltage at the source electrode 7 in FIG. 1 changes and this is reflected as an output from the "RF out" lead in FIG. 1. The impulse response is on the order of 2.7 pico seconds which is an order of magnitude faster than the 27 pico seconds response time reported in the literature.

It is evident that the light propagates in the light waveguide in a plane parallel to the electron stream, essentially in a plane or sheet overlying the electron stream. Although the light propagation used in the preferred embodiment described is transverse to the path of the electron stream, it is also within the scope of the invention for the light to propagate in the same direction as the electrons travel in the stream in other embodiments and in still additional embodiments to have the light propagation occur parallel and in a path that is at an angle to the electrons movement in that stream, all of which may be constructed by those of ordinary skill in the art who are given the principles presented in this specification Although the light waveguide illustrated is semicylindrical in shape, waveguides of other shapes may be grown using standard photolithographic and chemical processing techniques and substituted. Since the shape of the waveguide influences the amount of the optical wave that penetrates into the Gallium Arsenide material, the device design can control the depth of penetration and the consequent coupling of current.

The embodiment illustrated includes a gate electrode as part of the structure. Although that is a preferred structure, other embodiments may be constructed that do not include a gate. Though preferred, the inclusion of the gate is not critical for all possible applications, merely those that require a third electrode, which includes embodiments hereinafter presented. A high electron mobility transistor is known which, in the absence of a gate, normally allows current flow between the remaining two electrodes, source and drain.

Figure 3:
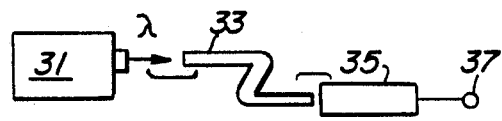
FIG. 3 illustrates symbolically an arrangement for inputting light to the photo detector.

One technique for coupling light to the photo detector is by a fiber optic cable as is illustrated in diagram form in FIG. 3. A laser 31 has its output coupled to one end of the fiber optic 33; in turn the other end of the fiber optic is directed against the side of the photo detector 35, preferably with the area of light being approximately the same as the end surface area or "window" of the waveguide. The photo detector's output is taken at 37 and may be applied to other apparatus, not illustrated. In a preferred form, the light waveguide and source should be integrally formed with the photo detector.

Figure 4:
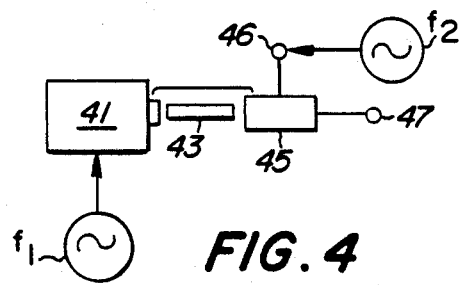
FIG. 4 illustrates in symbol form a frequency down converter that incorporates the photo detector of FIG. 1.

Although the preceding embodiment is described in its application as a photo detector, other uses are possible. For example, as represented in FIG. 4 in block diagram form, if the light inputted from light source 41 via fiber optic 43 to the waveguide of the photo detector 45 carries an RF signal, such as by modulating the light with an RF frequency represented as f1 in the figure, and if the control voltage at the gate is simultaneously an oscillating one, such as a high frequency AC signal as represented as f2 applied to gate input 46, the RF may be "down converted" to more manageable intermediate RF frequencies; that is, the device mixes the two RF signals, f1 and f2, and provides a different frequency which is lower in frequency than either the RF input or the RF applied to the gate, such as a difference frequency f1–f2.

Additional circuits may be integrated with the photo detector. For example, the output could be used to drive a HEMT type low noise amplifier. This amplifier is also a semiconductor and may be fabricated on the same substrate as the photo detector.

The invention provides for interaction between light and electrons in a semiconductor solid in which light energy is converted to current by an arrangement that provides high quantum efficiency in the conversion and very high speed response. An aspect to that invention is a photo detector that has a very fast response. A light waveguide formed in a portion of a high electron mobility semiconductor admits light, which propagates in a plane overlying the electron stream or gas formed in the semiconductor passing between two electrodes of the semiconductor by means of which the fringes of the light extending from the side of the waveguide. As the light propagates, it knocks out electrons that travel into the electron stream and combine therewith to effectively increase current passing between the two electrodes.

It is believed that the foregoing description of the preferred embodiment of the invention is sufficient in detail to enable one skilled in the art to make and use the invention. However, it is expressly understood that the details of the elements which are presented for the foregoing enabling purpose is not intended to limit the scope of the invention, in as much as equivalents to those elements and other modifications thereof, all of which come within the scope of the invention, become apparent to those skilled in the art upon reading this specification. Thus the invention is to be broadly construed within the full scope of the appended claims.

What is claimed is:

1. A monolithic high speed photodetector, comprising: a semiconductor high electron mobility field effect device of the type containing semiconductive gallium arsenide material, a source electrode, a gate electrode and a drain electrode, said source and drain electrodes being spaced apart on and defining an electrical current conducting path in said gallium arsenide material for conducting current therebetween in an essentially two dimensional current stream and said field effect device including a ridge shaped upper surface portion with said gate electrode being located in between said source and drain electrodes and being disposed atop said ridge shaped upper surface portion to place said gate electrode in an elevated position above said source and drain electrodes; light waveguide means for providing a light propagating path over said current conducting path with leakage of light into said material; said light waveguide means being integrally formed on said material and having an input window at an end for receiving light and being of a predetermined length equal to the width of said field effect device; said light waveguide means further comprising a sandwich of at least three layers of Aluminum Gallium Arsenide material having indices of refraction different from one another formed integral with said material with an intermediate one of said layers being of a higher index of refraction than the index of refraction of the other two of said layers and with said Gallium Arsenide material being of a higher index of refraction than any of said three layers; said light waveguide means being located adjacent and overlying and being oriented transverse to said current conducting path, whereby light in said waveguide means propagates transverse to said current stream and leaks into said gallium arsenide material for absorption by and causing release of electrons from said material, and electrons released thereby are carried into said current stream.

2. A monolithic high speed photodetector device, which comprises in an integrally formed assembly of semiconductor material containing a relatively two dimensional electron stream: light waveguide means for receiving and propagating light energy; said waveguide means situated astride and transverse said relatively two dimensional electron stream for permitting light propagating therein to leak along the length of the waveguide means into and be absorbed by said semiconductor material to release electrons from portions of said semiconductor material adjacent said electron stream for travel into said electron stream to contribute to current in said electron stream; said light waveguide means comprising a sandwich of at least three layers of Aluminum Gallium Arsenide material having indices of refraction differ et from one another with an intermediate one of said three layers being of a higher index of refraction than the index of refraction of the other two of said layers with the bottom one of said three layers permitting leakage of light to the material; said material having a higher index of refraction than the index of refraction of any of said three layers.

* * * * *